(12) United States Patent
Shibib et al.

(10) Patent No.: US 7,329,922 B2
(45) Date of Patent: Feb. 12, 2008

(54) DUAL-GATE METAL-OXIDE SEMICONDUCTOR DEVICE

(75) Inventors: Muhammed Ayman Shibib, Wyomissing, PA (US); Shuming Xu, Schnecksville, PA (US)

(73) Assignee: Agere Systems Inc., Allentown, PA (US)

( * ) Notice: Subject to any disclaimer, the term of this patent is extended or adjusted under 35 U.S.C. 154(b) by 172 days.

(21) Appl. No.: 10/999,705

(22) Filed: Nov. 30, 2004

(65) Prior Publication Data

US 2006/0113601 A1    Jun. 1, 2006

(51) Int. Cl.
*H01L 29/76* (2006.01)
*H01L 29/94* (2006.01)

(52) U.S. Cl. ............... 257/335; 257/336; 257/345; 257/409

(58) Field of Classification Search ........ 257/328, 257/335, 336, 341–346, 365, 366, 401, 408, 257/409
See application file for complete search history.

(56) References Cited

U.S. PATENT DOCUMENTS

| | | | |
|---|---|---|---|
| 6,825,531 B1 * | 11/2004 | Mallikarjunaswamy | 257/343 |
| 7,126,193 B2 * | 10/2006 | Baiocchi et al. | 257/343 |

* cited by examiner

*Primary Examiner*—Hung Vu (57) ABSTRACT

An MOS device includes first and second source/drain regions of a first conductivity type formed in a semiconductor layer of a second conductivity type proximate an upper surface of the semiconductor layer, the first and second source/drain regions being spaced apart relative to one another. A non-uniformly doped channel region of the first conductivity type is formed in the semiconductor layer proximate the upper surface of the semiconductor layer and at least partially between the first and second source/drain regions. An insulating layer is formed on the upper surface of the semiconductor layer. A first gate is formed on the insulating layer at least partially between the first and second source/drain regions and above at least a portion of the channel region, and at least a second gate formed on the insulating layer above at least a portion of the channel region and between the first gate and the second source/drain region. The second gate has a length which is substantially greater than a length of the first gate, the first and second gates being electrically isolated from one another.

18 Claims, 3 Drawing Sheets

DUAL-GATE METAL-OXIDE SEMICONDUCTOR DEVICE

FIELD OF THE INVENTION

The present invention relates generally to semiconductor devices, and more particularly relates to techniques for improving the high-frequency performance of a metal-oxide semiconductor (MOS) device.

BACKGROUND OF THE INVENTION

Power MOS devices, such as, for example, lateral diffused MOS (LDMOS) devices, are employed in a wide variety of applications, such as, for example, power amplification, switching, etc. In applications where high-frequency operation is desired, such as in a radio frequency (RF) range (e.g., above about 1 gigahertz (GHz)), a conventional LDMOS device generally uses a shorter gate length, in comparison to the gate length of a typical LDMOS device that is not adapted for high frequency applications, in order to improve the RF performance of the device. When operating the device in the RF frequency range, a shorter gate length is generally necessary for achieving a high input impedance. However, reducing the gate length undesirably increases hot-carrier induced (HCI) degradation in the device. Reducing the gate length also increases the gate resistance ($R_g$) associated with the device. Since the output gain of the MOS device is inversely proportional to the gate resistance of the device, increasing the gate resistance results in a decrease in the output gain of the device, which is particularly undesirable in an amplifier application. Moreover, there is presently no known mechanism by which an LDMOS device is able to protect itself from an over-power condition that places the device outside a safe operating area (SOA) of the device, thus resulting in a catastrophic failure of the device.

HCI degradation in an MOS device generally results from heating and subsequent injection of carriers into a surface oxide layer of the device, which results in a localized and nonuniform buildup of interface states and oxide charges near and underneath the surface oxide in a gate and/or drift region of the device. This phenomenon can produce undesirable variations in certain characteristics of the MOS device, including on-state resistance, transconductance, drain current, etc., thus impacting the performance and/or reliability of the device. It is well known that HCI degradation is a strong function of electric field distributions within the MOS device. While the lateral electric field near the gate in a drain side of the device is primarily responsible for heating and avalanche, the transverse electric field primarily influences carrier injection into the gate oxide. The reduction of channel length in the MOS device affects the internal electric field distributions, and hence the carrier heating and injection processes. As device geometries shrink, the localized internal electric field distributions can become even higher in the device, thus exacerbating the problem.

It is well known that HCI degradation in an LDMOS device can be reduced by decreasing an impurity doping concentration in a drift region of the device and/or employing a field plate for shielding the gate of the device. However, decreasing the doping concentration of the drift region also undesirably increases an on-state resistance of the device. Additionally, employing a field plate in the LDMOS device to reduce HCI degradation also undesirably increases an input capacitance of the device, due at least in part to an overlap of the field plate on the gate. The increase in input capacitance of the LDMOS device often significantly degrades the high-frequency performance of the device, so as to lessen any beneficial reduction in HCI degradation which may be achieved as a result of the field plate.

There exists a need, therefore, for an MOS device having improved high frequency performance, such as power gain and efficiency, and/or reliability, that does not suffer from one or more of the problems exhibited by conventional MOS devices. It would also be advantageous if the MOS device provided an internal self-protection mechanism for preventing device failure during an over-power condition. Moreover, it would be desirable if the improved MOS device was compatible with existing integrated circuit (IC) fabrication process technologies.

SUMMARY OF THE INVENTION

The present invention meets the above-noted need by providing techniques for beneficially improving high frequency performance of an MOS device, without significantly increasing HCI degradation in the device. In accordance with an illustrative embodiment of the invention, the improved MOS device comprises a dual-gate structure. The dual-gate structure may be formed, for example, by effectively splitting a relatively long gate into two isolated adjacent portions, namely, a first gate configurable for receiving a direct current (DC) bias signal and a second gate configurable for receiving an RF signal. The second gate is substantially short in length so as to achieve a desired low input capacitance, and the first gate is substantially longer than the second gate so as to reduce HCI degradation in the device. By controlling the DC bias signal level applied to the second gate, the device can be selectively turned off while the first gate is connected to an RF input signal. Thus, the techniques of the present invention can be used to provide an internal self-protection mechanism for preventing device failure resulting from an over-power condition. Furthermore, the improved MOS device of the present invention can be fabricated using conventional complementary metal-oxide-semiconductor (CMOS) compatible process technology. Consequently, the cost of manufacturing the device is not significantly increased.

In accordance with one aspect of the invention, an MOS device includes first and second source/drain regions of a first conductivity type formed in a semiconductor layer of a second conductivity type proximate an upper surface of the semiconductor layer, the first and second source/drain regions being spaced apart relative to one another. A non-uniformly doped channel region of the first conductivity type is formed in the semiconductor layer proximate the upper surface of the semiconductor layer and at least partially between the first and second source/drain regions. An insulating layer is formed on the upper surface of the semiconductor layer. A first gate is formed on the insulating layer at least partially between the first and second source/drain regions and above at least a portion of the channel region, and at least a second gate formed on the insulating layer above at least a portion of the channel region and between the first gate and the second source/drain region. The second gate has a length which is substantially greater than a length of the first gate, the first and second gates being electrically isolated from one another.

In accordance with another aspect of the invention, a dual-gate MOS device is operatively coupled to a conditioning circuit. The conditioning circuit generates a substantially DC voltage which is applied to a DC gate of the dual-gate MOS device for the biasing the device to a desired operating point. The bias voltage generated by the conditioning circuit is a function of an input signal applied to a high-frequency gate of the dual-gate MOS device. The dual-gate MOS device, in conjunction with the conditioning circuit, is configured to provide a substantially linear output signal despite varying input signal levels, while providing a self-protection mechanism for protecting the device from failure resulting at least in part from an over-power condition.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative MOS IC fabrication technology suitable for forming discrete RF LDMOS transistors, as well as other devices and/or circuits. It should be appreciated, however, that the present invention is not limited to the fabrication of this or any particular device or circuit. Rather, the invention is more generally applicable to an MOS device comprising an improved gate arrangement which advantageously enables the MOS device to provide improved high frequency performance and/or reliability, while achieving increased gain and reduced HCI degradation effects. Moreover, the gate arrangement of the present invention can be used to provide an internal self-protection mechanism for protecting the device from failure during an over-power condition to which the device may be subjected.

Although implementations of the present invention are described herein with specific reference to an LDMOS device, it is to be appreciated that the techniques of the present invention are similarly applicable to other devices, such as, but not limited to, a vertical diffused MOS (DMOS) device, an extended drain MOSFET device, etc., with or without modifications thereto, as will become apparent to those skilled in the art. Furthermore, although the invention will be described herein in the context of an N-channel MOS device, it is to be understood that a P-channel MOS device could be similarly formed by substituting opposite polarities to those given for the N-channel embodiment, in at least the active regions of the device, and that the techniques and advantages of the present invention will also apply to the alternative embodiment.

It is to be appreciated that the various layers and/or regions shown in the accompanying figures may not be drawn to scale. Furthermore, one or more semiconductor layers of a type commonly used in such IC devices may not be explicitly shown in a given figure for ease of explanation. This does not imply that the semiconductor layers not explicitly shown are omitted in the actual IC device.

Figure 1:
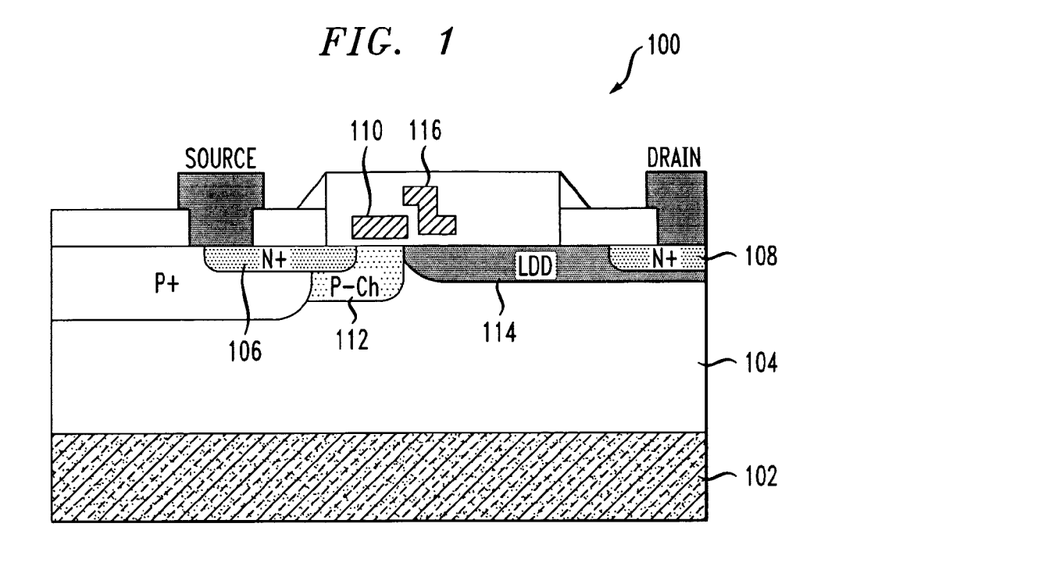
FIG. 1 is a cross-sectional view illustrating at least a portion of a conventional LDMOS device.

FIG. 1 illustrates a cross-sectional view of at least a portion of a semiconductor wafer comprising a conventional LDMOS device 100. The LDMOS device 100 includes a semiconductor substrate 102 and an epitaxial layer 104 formed on the substrate. A source region 106 and a drain region 108 are formed in the epitaxial layer 104 of the device 100. The LDMOS device 100 further includes a gate 110 formed above a channel region 112 of the device. The channel region 112 is at least partially formed between the source and drain regions. The LDMOS device 100 includes a drift region 114 formed in the epitaxial layer 104, proximate the upper surface of the epitaxial layer. The drift region 114 is located between the channel region 112 and the drain region 108, and typically has an impurity doping concentration that is lower compared to a doping concentration of the drain region. As such, the drift region 114 is often referred to as a lightly doped drain (LDD) region. In order to reduce HCI degradation, the device 100 may include a field plate 116 formed primarily above the drift region 114 and between the gate 110 and the drain region 108. The field plate 116 is generally located in close relative proximity to the upper surface of the epitaxial layer 104. The field plate 116, which typically comprises a metal, is electrically isolated from the gate 110 and is often electrically connected to the source region 106.

For an LDMOS device to function satisfactorily in a high-frequency environment (e.g., above about 1 GHz), the input impedance and gain associated with the device should be maximized. In order to accomplish this, a gate 110 having a short length (e.g., less than about 0.5 micrometers (μm)) can be employed. However, as previously stated, using a short gate generally results in increased HCI degradation and increased gate resistance. HCI degradation can undesirably affect certain reliability characteristics of the device, while a high gate resistance may significantly limit the gain of the device. Consequently, the conventional LDMOS device structure is not fully optimized for use in high-frequency (e.g., RF) applications.

Figure 2:
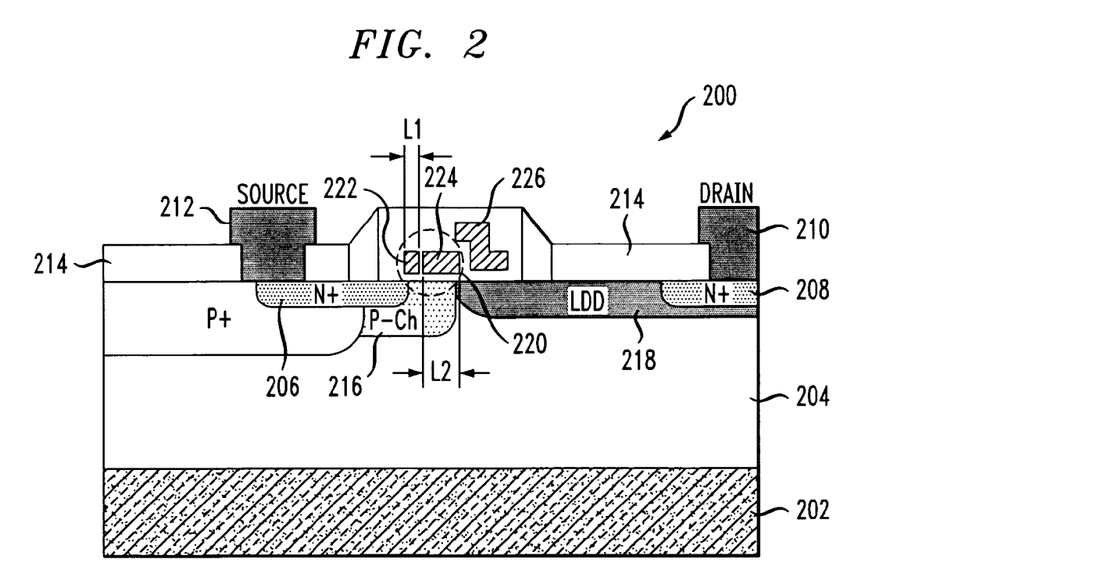
FIG. 2 is a cross-sectional view illustrating at least a portion of an exemplary LDMOS device, formed in accordance with an illustrative embodiment of the present invention.

FIG. 2 is a cross-sectional view illustrating at least a portion of a semiconductor wafer comprising an exemplary LDMOS device 200, formed in accordance with one embodiment of the present invention. The exemplary LDMOS device 200 includes a semiconductor substrate 202. The substrate 202 is commonly formed of single-crystal silicon (e.g., having a <100> or <111> crystal orientation), although suitable alternative materials may also be used, such as, but not limited to, germanium, gallium arsenide, gallium nitride etc. Additionally, the substrate is preferably modified by adding an impurity or dopant (e.g., boron, phosphorous, arsenic, etc.) to change a conductivity of the material (e.g., n-type or p-type). In a preferred embodiment of the invention, the substrate 202 is of p-type conductivity and may thus be referred to as a p+ substrate. A p+ substrate may be formed by adding a p-type impurity or dopant (e.g., boron) of a known concentration level (e.g., about 5e18 to about 5e19 atoms per cubic centimeter) to the substrate material, such as by using a diffusion or implant step, to change the conductivity of the material as desired.

An epitaxial layer 204 may be formed on at least a portion of the substrate 202, such as by a standard epitaxy process. By introducing selected types of impurities (e.g., boron, phosphorous, arsenic, etc.) into the epitaxial layer 204, a resistivity of the epitaxial layer can be modified as desired. The thickness of the epitaxial layer 204 is typically less than about 10 micrometers (μm), although the present invention is not limited to any particular thickness of the epitaxial layer. In a preferred embodiment of the invention, the epitaxial layer 204 is doped with a p-type impurity (e.g., boron). The doping concentration of the epitaxial layer 204 is preferably lower (e.g., about 1e15 to about 1e16 atoms per cubic centimeter) in comparison to the doping concentration of the substrate 202.

The term "semiconductor layer" as may be used herein refers to any semiconductor material upon which and/or in which other materials may be formed. The semiconductor layer may comprise a single layer, such as, for example, substrate 202, or it may comprise multiple layers, such as, for example, the substrate and epitaxial layer 204. The semiconductor wafer comprises the substrate 202, with or without the epitaxial layer 204, and preferably includes one or more other semiconductor layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which and/or in which a semiconductor structure may be formed.

The exemplary LDMOS device 200 includes a source region 206 and a drain region 208 formed in the epitaxial layer 204, proximate an upper surface of the epitaxial layer, such as by a conventional implant and/or diffusion process. The source and drain regions are preferably doped, such as by a conventional implant step, with an impurity of a known concentration level to selectively change the conductivity of the material as desired. Preferably, the source and drain regions 206, 208 have a conductivity type associated therewith which is opposite a conductivity type of the epitaxial layer 204, so that active regions can be formed in the device. In a preferred embodiment of the invention, the source and drain regions 206, 208 are of n-type conductivity.

It is to be appreciated that, in the case of a simple MOS device, because the MOS device is symmetrical by nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region. In an LDMOS device, which is generally not bidirectional, such source and drain designations may not be arbitrarily assigned.

The LDMOS device 200 preferably includes a drain contact 210, electrically connected to the drain region 208, and a source contact 212, electrically connected to the source region 206. Electrical connection to the source region 206 may alternatively be made by way of a substrate contact (not shown). In this instance, electrical connection between the source region 206 and the substrate 202 may be provided, for example, by forming one or more trench sinkers (not shown) through the epitaxial layer 204 to the substrate. The trench sinkers may be formed in a conventional manner, such as, for example, by opening windows in the epitaxial layer 204 to expose the substrate 202 (e.g., by photolithographic patterning and etching), and filling the trenches with a conductive material, as will be understood by those skilled in the art. An oxide layer 214 (e.g., silicon dioxide), or an alternative insulating layer, is generally formed on at least a portion of the upper surface of the epitaxial layer 204 to electrically isolate the source and drain contacts of the device as well as to protect the device.

A channel region 216 and a drift region 218 are formed in the exemplary LDMOS device 200. The channel region 216 is formed near the source region 206, while the drift region 218 preferably extends from the channel region 216 to the drain region 208. The channel region 216 may be formed of a material having the same conductivity type as the epitaxial layer 204, preferably p-type. Furthermore, the channel region 216 is non-uniformly doped, as in the case of a diffused MOS (DMOS) device, such that a portion of the channel region closest to the source region 206 has a higher doping level (e.g., about 1e17 atoms per cubic centimeter) compared to a doping level of a portion of the channel region closest to the drain region (e.g., about 1e15 atoms per cubic centimeter). Thus, the doping level of the channel region 216 decreases as the channel region extends from the source region 206 towards the drain region 208. The drift region 218 may be formed of a material having the same conductivity type as the source and drain regions, preferably n-type, although the relative doping concentration of the drift region is typically lower (e.g., e.g., about 1e14 to about 1e15 atoms per cubic centimeter) compared to the source and drain regions 206, 208. Accordingly, the drift region 218 may be referred to herein as an LDD region.

The exemplary LDMOS device 200 further includes a gate 220 formed above at least a portion of the channel region 216 and proximate the upper surface of the epitaxial layer 204. The application of a voltage potential to the gate 220, greater than or equal to a threshold voltage of the device, controls a conduction in the channel region 216, as will be understood by those skilled in the art. The gate 220 may be formed of, for example, polysilicon material, although alternative suitable materials (e.g., metal) may be similarly employed. The gate 220 is electrically isolated from the channel region 216 by at least a portion of the oxide layer 214 formed under the gate. The portion of the oxide layer 214 under the gate 220 is often referred to as gate oxide. While the thickness of the gate oxide is preferably about 200 nanometers (nm), the present invention is not limited to any particular gate oxide thickness.

In order to reduce HCI degradation in the LDMOS device 200, a field plate 226, or an alternative shielding structure, may be formed on the oxide layer 214, between the gate 220 and the drain region 208. The field plate 226 is preferably formed in close relative proximity to the upper surface of the epitaxial layer 204, extending laterally above the drift region 218 of the LDMOS device 200. The field plate 226 is electrically isolated from the gate 220 by the oxide layer 214 formed on the upper surface of the device 200. Moreover, the thickness of the portion of the oxide layer 214 under the field plate 226 may be substantially the same as the gate oxide thickness (e.g., about 30 nm to about 300 nm), although a thinner or thicker oxide thickness may be employed. The reduction in HCI degradation in the LDMOS device 200 may be affected to some extent by the thickness of the oxide layer 214 under the field plate 226.

The field plate 226 may overlap at least an edge of the gate 220 at a first end, as shown, although the field plate may alternatively be configured in a substantially non-overlapping arrangement relative to the gate. The amount of overlap of the field plate 226 above the gate 220 is preferably minimized in order to reduce a gate-to-source capacitance (Cgs) associated with the LDMOS device 200. A second end of the field plate 226 is formed above the drift region 218 as the field plate extends substantially horizontally from the edge of the gate 220 towards the drain region 208. The field plate 226, like the gate 220, preferably comprises polysilicon, although suitable alternative materials (e.g., metal) may also be utilized.

Although not shown, the field plate 226 in the exemplary LDMOS device 200 is preferably electrically connected (e.g., strapped) to the source region 206 using, for example, one or more conductive traces, contact vias and/or conductive plugs (not shown). Suitable methods for forming the electrical connection between the field plate 226 and the source region 206 will be apparent to those skilled in the art.

The shape of the field plate 226 can affect a distribution of equipotential lines, and thus an electric field distribution, in the LDMOS device 200. Thus, by controlling the shape of the field plate 226, the electric field in at least the drift region 218 of the LDMOS device 200 can be more uniformly distributed so as to reduce HCI degradation. It is to be understood that the present invention is not limited to the particular shape and/or size of the field plate 226 shown.

As previously stated, making the gate length as short as possible is desired during high-frequency operation of the MOS device, at least in part to reduce the gate-to-source capacitance Cgs associated with the device. However, use of a shorter gate can have undesirable consequences at DC operation of the device, such as, but not limited to, increasing HCI degradation and/or reducing a drain-to-source breakdown voltage in the device. Additionally, a shorter gate has an increased gate resistance associated therewith, thus resulting in a decreased gain of the device.

Consequently, in accordance with an important aspect of the present invention, the gate 220 in the exemplary LDMOS device 200 is formed as a structure comprising a plurality of portions 222 and 224, each of the portions being configured for a desired operation of the device. For example, one of the portions 224 is preferably configured for receiving a DC bias signal, and may therefore be referred to as a DC gate, and another of the portions 222 is preferably configured for receiving a high-frequency (e.g., RF) signal, and may therefore be referred to as a high-frequency gate. The high-frequency gate 222 and the DC gate 224 are formed substantially over the channel region 216, so that the channel region is controlled by both the high-frequency gate and the DC gate, although not necessarily to the same extent. Although the gate 220 in the exemplary LDMOS device 200 is shown as being comprised of two portions 222, 224, it is to be understood that more than two portions may be used to form the gate. Additionally, while the two portions 222, 224 are preferably formed of the same material (e.g., polysilicon, metal, etc.), it is contemplated that the two gate portions may be formed of different materials relative to one another. It is further contemplated that the portions of the oxide layer 214 under the two gate portions 222, 224 can be formed of a different thickness relative to one another so as to improve the transconductance of the device without significantly affecting other characteristics, such as, for example, HCI degradation or high frequency performance.

Figure 3:
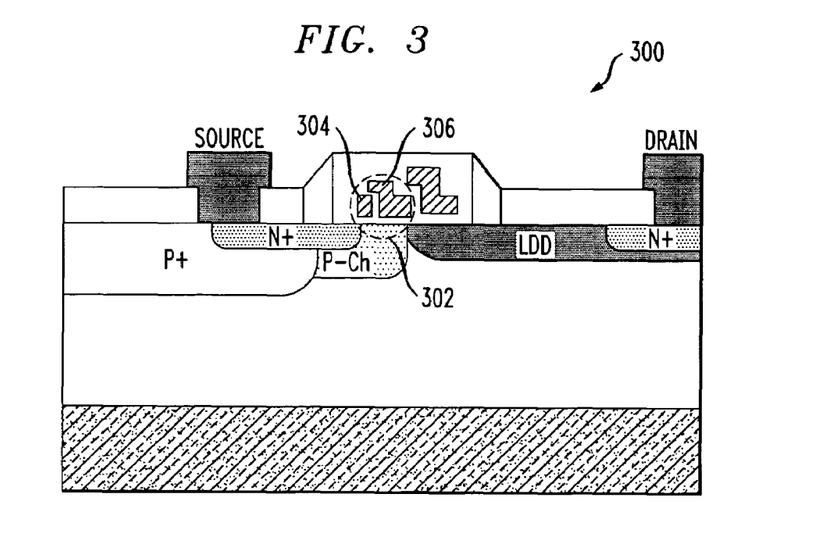
FIG. 3 is a cross-sectional view illustrating at least a portion of an alternative gate structure for use in the exemplary LDMOS device of FIG. 2, formed in accordance with another illustrative embodiment of the present invention.

The two gate portions 222, 224 are electrically isolated from one another and may be formed in a substantially non-overlapping arrangement relative to one another, as shown in FIG. 2. When configured in a substantially non-overlapping arrangement, the two gate portions 222, 224 are preferably formed in close relative proximity to one another, such as, for example, spaced less than about 0.1 μm apart. Keeping the spacing between gate portions 222, 224 to a minimum helps reduce HCI degradation in the device resulting at least in part from an electric field distribution in the channel region 216 proximate the gap between the two gate portions. Alternatively, the gate portions may at least partially overlap one another. In this configuration, the spacing between gate portions may be less critical. In order to reduce the input capacitance associated with the device, however, the amount of overlap of one gate portion on the other gate portion is preferably minimized (e.g., less than about 0.1 μm). Although there may be some coupling which occurs between the DC gate 206 and high frequency gate 208, particularly at the sides of the DC gate 206 facing the first end 222 of high frequency gate 208, this coupling will be minimal, especially if the cross-sectional thickness of the DC gate 206 is minimized. An exemplary LDMOS device 300 comprising a gate 302 including a plurality of overlapping portions 304 and 306 is illustrated in FIG. 3, in accordance with another embodiment of the invention. The LDMOS device 300 may be formed in a manner similar to LDMOS device 200 shown in FIG. 2. Once again, although the gate 302 in LDMOS device 300 is shown as being comprised of two portions 304, 306, it is to be understood that more than two portions may be used to form the gate.

By splitting the gate into multiple portions, with each portion being used in a different frequency range (e.g., DC and RF), the present invention is able to selectively tailor the respective portions of the gate 220 for their intended frequency ranges of operation, thereby satisfying the differing gate characteristics required for the corresponding frequency ranges of use. For instance, the high-frequency gate 222 is preferably formed having a relatively short gate length L1, such as less than about 0.25 μm, depending upon the IC process technology employed. The short gate length provides a substantially high input impedance, thereby ensuring high gain and a wide bandwidth for the LDMOS device 200. Alternatively, the DC gate 224 is preferably formed having a gate length L2 which is substantially longer than the high-frequency gate 222, such as, for example, greater than about 0.5 μm. The longer gate length is beneficial for reducing HCI degradation in the device 200. In a preferred embodiment of the invention, a ratio between the gate length of the DC gate 224 and the gate length of the high-frequency gate 222 is greater than about 1.5, although the invention is not to this specific ratio. It is to be appreciated that the invention is not limited to the precise shapes and/or arrangement of the portions 222, 224 of the gate 220 shown, and that alternative configurations of the overall gate structure are similarly contemplated, as will become apparent to those skilled in the art.

When gate length is decreased, HCI degradation increases severely. Thus, including the much longer DC gate 224 effectively decouples the gate 220 from the effects of HCI degradation otherwise exhibited by a shorter high-frequency gate 222 alone. Separating the gate 220 into two portions enables the LDMOS device 200 to achieve the full DC characteristics and benefits of a long gate while concurrently achieving the high-frequency advantages of a short gate. It is to be understood that the high-frequency signal applied to the high-frequency gate 222 may include a DC component superimposed therewith, so as to change a mode of operation of the device 200 from class C to class A, AB or B, or vice versa, depending on the level of DC offset in the signal. The combination of the two gate portions 222, 224 thus enables the LDMOS device 200 to advantageously overcome one or more of the problems exhibited in conventional MOS devices.

In order to further improve the high frequency performance of the LDMOS device 200, the gate oxide 214 beneath the high-frequency gate 222 is preferably formed such that it is substantially thinner than the gate oxide under the DC gate 224, in accordance with another aspect of the invention. This improves the transconductance ($g_m$) of the device, thereby benefitting the gain. Since the gate-to-source capacitance of the LDMOS device 200 is inversely proportional to gate oxide thickness, reducing the thickness of the gate oxide under the gate significantly increases the gate-to-source capacitance of the device. However, as previously stated, making the gate oxide thinner undesirably reduces the breakdown voltage characteristics of the device. Rather than making the gate oxide thinner under the entire gate 220, as is done in conventional LDMOS devices, thereby causing a significant increase in the gate-to-source capacitance, only the portion of the gate oxide beneath the high-frequency gate 222 is made thinner in comparison to the gate oxide beneath the DC gate 224. Using the dual gate structure of the present invention, the gate oxide under the DC gate 224 can be formed of a different thickness compared to the high-frequency gate 222. In this manner, the gate-to-source capacitance associated with the high-frequency gate 222 does not increase substantially, but the transconductance is improved significantly.

Figure 4:
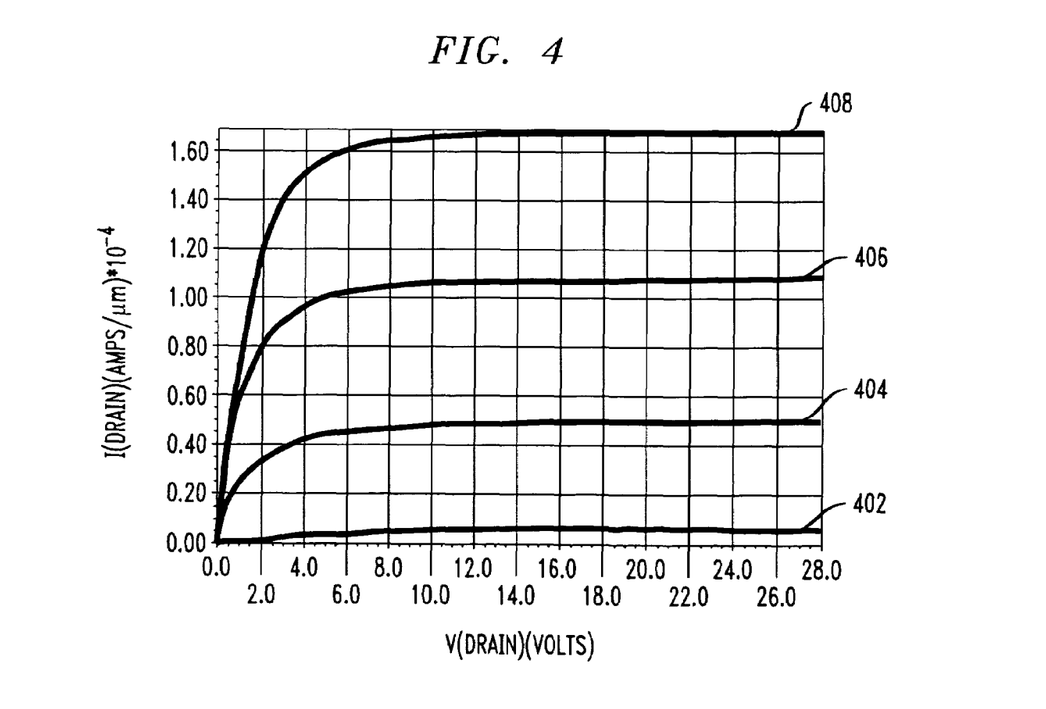
FIG. 4 is a graphical representation depicting exemplary simulation results of on-state characteristics of the LDMOS device shown in FIG. 1 for various bias levels, in accordance with the present invention.

FIG. 4 is a graphical representation illustrating exemplary on-state characteristic simulations for the LDMOS device 200 shown in FIG. 2. As apparent from the figure, when a positive bias voltage, greater than a threshold voltage of the device, is applied to the DC gate, a standard on-state characteristic may be obtained, as represented by curve 402. As the bias voltage applied to the DC gate is increased, as represented by curves 404, 406 and 408, one or more on-state characteristics of the device, such as, for example, on-state resistance and knee voltage, changes accordingly. Because the DC gate 224 in the exemplary LDMOS device 200 is formed substantially above the channel region 216, the bias voltage applied to the DC gate can be selectively varied to control certain on-state characteristics of the device, including, but not limited to, on-state resistance, knee voltage, etc., as desired. Moreover, channel conduction in the device can be effectively cut-off by application of a specified voltage to the DC gate 224. Thus, in accordance with another aspect of the present invention, by detecting an input signal applied to the high-frequency gate 222, the DC bias voltage applied to the DC gate 224 can be varied as a function of the input signal so as to control a peak power handling capability of the device 200 and/or to shut down the device. In this manner, a linearity and/or efficiency of the device can be improved while providing a self-protection mechanism for protecting the device from failure.

Figure 5:
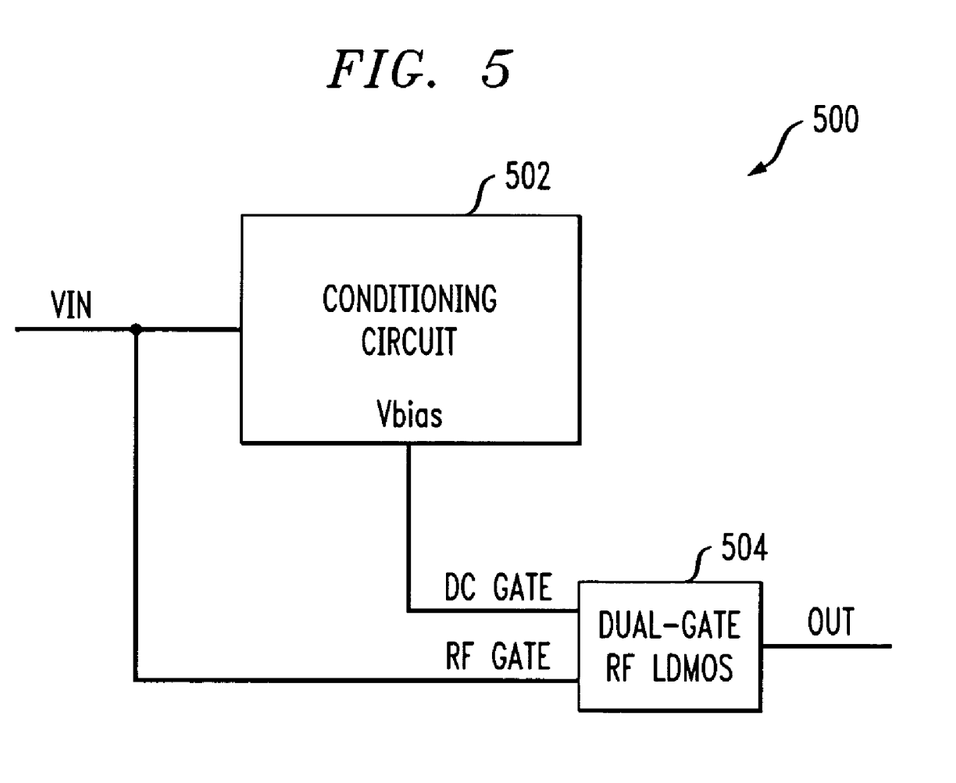
FIGS. 5 is a block diagram illustrating an exemplary circuit for improving linearity, efficiency and/or reliability of the LDMOS device shown in FIG. 2, in accordance with another aspect of the invention.

FIG. 5 illustrates an exemplary circuit 500 for improving a linearity, efficiency and/or reliability of the LDMOS device 200 depicted in FIG. 2, in accordance with another aspect of the present invention. The circuit 500 comprises a conditioning circuit 502 and a dual-gate RF LDMOS device 504 coupled to the conditioning circuit. The LDMOS device 504 may be formed in a manner similar to the exemplary LDMOS device 200 shown in FIG. 2. The conditioning circuit 502 is preferably configured to detect an input signal VIN applied to an RF gate of LDMOS device 504, and to generate a substantially DC bias signal Vbias. The bias signal Vbias is applied to a DC gate of the LDMOS device 504 for biasing the device to a known operating point. The RF gate and DC gate of LDMOS device 504 may be formed in a manner consistent with the high-frequency gate 222 and DC gate 224, respectively, of the exemplary LDMOS device 200 shown in FIG. 2.

The conditioning circuit 502 may include an envelope detector (not shown), or alternative signal detection circuitry, for detecting an envelope and/or other portions of the input signal VIN. Furthermore, the conditioning circuit 502 may include a look-up table and a digital-to-analog converter (not shown), or alternative bias generating circuitry, for providing a programmed bias signal to the LDMOS device 504 which is a function of the input signal. By way of example only, when there is a power surge in the input signal VIN delivered to the RF gate of the LDMOS device 504, the conditioning circuit 502 preferably responds by increasing the bias voltage Vbias applied to the DC gate of the LDMOS device 504, thereby causing a reduced on-resistance and knee voltage of the LDMOS device and allowing higher power to be delivered at an output OUT of the device without a significant increase in distortion. Additionally, when the input signal is determined to be too high so as to otherwise result in device failure, the conditioning circuit 502 preferably decreases the bias voltage Vbias so as to effectively shut down the LDMOS device 504 and thereby protect the device from failure. Thus, the exemplary circuit 500 provides a beneficial mechanism for improving linearity, efficiency and reliability in the LDMOS device.

The exemplary LDMOS device of the present invention may be implemented in an integrated circuit. In forming integrated circuits, a plurality of identical die are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A metal-oxide-semiconductor (MOS) device, comprising:
   a semiconductor layer of a first conductivity type;
   first and second source/drain regions of a second conductivity type formed in the semiconductor layer proximate an upper surface of the semiconductor layer, the first and second source/drain regions being spaced apart relative to one another;
   a channel region of the first conductivity type formed in the semiconductor layer proximate the upper surface of the semiconductor layer and at least partially between the first and second source/drain regions, the channel region being non-uniformly doped;
   an insulating layer formed on at least a portion of the upper surface of the semiconductor layer;
   a first gate formed on the insulating layer at least partially between the first and second source/drain regions and substantially over the channel region; and
   at least a second gate formed on the insulating layer substantially over the channel region and between the first gate and the second source/drain region, the second gate having a length which is greater than a length of the first gate, the first and second gates being electrically isolated from one another;

wherein a conduction of the channel region is selectively controllable as a function of first and second signals applied to the first and second gates, respectively.

2. The device of claim 1, wherein a first portion of the insulating layer under the first gate is formed having a first thickness and a second portion of the insulating under the second gate is formed having a second thickness, the second thickness being different than the first thickness.

3. The device of claim 1, wherein the channel region is formed having a doping concentration level that is highest proximate the first source/drain region and decreases as the channel region extends toward the second source/drain region.

4. The device of claim 3, wherein the doping concentration level of the channel region varies from about 1e18 to about 1e15 atoms per cubic centimeter.

5. The device of claim 1, wherein the second gate is configured so as to overlap at least a portion of the first gate.

6. The device of claim 1, wherein a ratio between the length of the second gate and the length of the first gate is greater than about 1.5.

7. The device of claim 1, wherein the first and second gates are configured in a substantially non-overlapping arrangement relative to one another.

8. A metal-oxide-semiconductor (MOS) device, comprising:

a semiconductor layer of a first conductivity type;

first and second source/drain regions of a second conductivity type formed in the semiconductor layer proximate an upper surface of the semiconductor layer, the first and second source/drain regions being spaced apart relative to one another;

a channel region of the first conductivity type formed in the semiconductor layer proximate the upper surface of the semiconductor layer and at least partially between the first and second source/drain regions, the channel region being non-uniformly doped;

an insulating layer formed on at least a portion of the upper surface of the semiconductor layer;

a first gate formed on the insulating layer at least partially between the first and second source/drain regions and substantially over the channel region; and at least a second gate formed on the insulating layer substantially over the channel region and between the first gate and the second source/drain region, the second gate having a length which is greater than a length of the first gate, the first and second gates being electrically isolated from one another;

wherein the first gate is configurable for receiving a first signal in a first frequency range and the second gate is configurable for receiving a second signal in a second frequency range, the first frequency range being higher than the second frequency range.

9. The device of claim 8, wherein the second signal comprises a substantially direct current signal for biasing the channel region to a desired operating point.

10. The device of claim 8, wherein the second frequency range comprises substantially direct current components and the first frequency range comprises substantially radio frequency components.

11. A metal-oxide-semiconductor (MOS) device, comprising:

a semiconductor layer of a first conductivity type;

first and second source/drain regions of a second conductivity type formed in the semiconductor layer proximate an upper surface of the semiconductor layer, the first and second source/drain regions being spaced apart relative to one another;

a channel region of the first conductivity type formed in the semiconductor layer proximate the upper surface of the semiconductor layer and at least partially between the first and second source/drain regions, the channel region being non-uniformly doped;

an insulating layer formed on at least a portion of the upper surface of the semiconductor layer;

a first gate formed on the insulating layer at least partially between the first and second source/drain regions and substantially over the channel region;

at least a second gate formed on the insulating layer substantially over the channel region and between the first gate and the second source/drain region, the second gate having a length which is greater than a length of the first gate, the first and second gates being electrically isolated from one another; and a shielding structure formed proximate the upper surface of the semiconductor layer and at least partially between the second gate and the second source/drain region, the shielding structure being electrically connected to the first source/drain region and electrically isolated from the first and second gates.

12. The device of claim 11, wherein the shielding structure is configured so as to overlap at least a portion of the second gate.

13. A metal-oxide-semiconductor (MOS) device, comprising:

a semiconductor layer of a first conductivity type;

first and second source/drain regions of a second conductivity type formed in the semiconductor layer proximate an upper surface of the semiconductor layer, the first and second source/drain regions being spaced apart relative to one another;

a channel region of the first conductivity type formed in the semiconductor layer proximate the upper surface of the semiconductor layer and at least partially between the first and second source/drain regions, the channel region being non-uniformly doped;

an insulating layer formed on at least a portion of the upper surface of the semiconductor layer;

a first gate formed on the insulating layer at least partially between the first and second source/drain regions and substantially over the channel region; and at least a second gate formed on the insulating layer substantially over the channel region and between the first gate and the second source/drain region, the second gate having a length which is greater than a length of the first gate, the first and second gates being electrically isolated from one another;

wherein the device is configured such that a level of a first signal applied to the second gate is selectively controlled as a function of a level of a second signal applied to the first gate, so as to substantially maintain a linearity of the device over a desired range of levels of the first signal.

14. A metal-oxide-semiconductor (MOS) device, comprising:
- a semiconductor layer of a first conductivity type;
- first and second source/drain regions of a second conductivity type formed in the semiconductor layer proximate an upper surface of the semiconductor layer, the first and second source/drain regions being spaced apart relative to one another;
- a channel region of the first conductivity type formed in the semiconductor layer proximate the upper surface of the semiconductor layer and at least partially between the first and second source/drain regions, the channel region being non-uniformly doped;
- an insulating layer formed on at least a portion of the upper surface of the semiconductor layer;
- a first gate formed on the insulating layer at least partially between the first and second source/drain regions and substantially over the channel region;
- at least a second gate formed on the insulating layer substantially over the channel region and between the first gate and the second source/drain region, the second gate having a length which is greater than a length of the first gate, the first and second gates being electrically isolated from one another; and
- a conditioning circuit, the conditioning circuit including an input coupled to the first gate and an output coupled to the second gate, the conditioning circuit being configurable for generating a bias signal at the output for biasing the device to a desired operating point, the bias signal being a function of an input signal applied to the input.

15. The device of claim 14, wherein the conditioning circuit is operative to increase a level of the bias signal so as to reduce at least one of an on-state resistance and a knee voltage of the device in response to an increased level of the input signal.

16. The device of claim 14, wherein the conditioning circuit is operative to shut off the device when the input signal exceeds a desired threshold level.

17. The device of claim 14, wherein the device, in conjunction with the conditioning circuit, is configurable for generating a substantially linear output signal despite varying levels of the input signal.

18. An integrated circuit including at least one metal-oxide-semiconductor (MOS) device, the at least one MOS device comprising:
- a semiconductor layer of a first conductivity type;
- first and second source/drain regions of a second conductivity type formed in the semiconductor layer proximate an upper surface of the semiconductor layer, the first and second source/drain regions being spaced apart relative to one another;
- a channel region of the first conductivity type formed in the semiconductor layer proximate the upper surface of the semiconductor layer and at least partially between the first and second source/drain regions, the channel region being non-uniformly doped;
- an insulating layer formed on at least a portion of the upper surface of the semiconductor layer;
- a first gate formed on the insulating layer at least partially between the first and second source/drain regions and substantially over the channel region; and
- at least a second gate formed on the insulating layer substantially over the channel region and between the first gate and the second source/drain region, the second gate having a length which is substantially greater than a length of the first gate, the first and second gates being electrically isolated from one another;
- wherein a conduction of the channel region is selectively controllable as a function of first and second signals applied to the first and second gates, respectively.

* * * * *